United States Patent [19]

Takeda et al.

[11] Patent Number: 4,902,972

[45] Date of Patent: Feb. 20, 1990

[54] METHOD AND APPARATUS FOR CAUSING NUCLEAR MAGNETIC RESONANCE OF AN OBJECT

[75] Inventors: Ryuzaburo Takeda, Mito; Hideaki Koizumi, Katsuta; Toshiaki Aritomi, Tohkai, all of Japan

[73] Assignee: Hitachi, Ltd., Tokyo, Japan

[21] Appl. No.: 254,652

[22] PCT Filed: Dec. 23, 1987

[86] PCT No.: PCT/JP87/01021

§ 371 Date: Oct. 24, 1988

§ 102(e) Date: Oct. 24, 1988

[30] Foreign Application Priority Data

Dec. 24, 1986 [JP] Japan .................. 61-306450

[51] Int. Cl.$^4$ ............................................. G01R 33/20
[52] U.S. Cl. .................................. 324/309; 324/307
[58] Field of Search ............... 324/300, 307, 308, 309, 324/312, 313, 314

[56] References Cited

U.S. PATENT DOCUMENTS

| | | | |
|---|---|---|---|
| 4,593,247 | 6/1986 | Glover | 324/307 |
| 4,644,278 | 2/1987 | Sano et al. | 324/307 |
| 4,689,567 | 8/1987 | Maudsley | 324/309 |

*Primary Examiner*—Michael J. Tokar
*Attorney, Agent, or Firm*—Antonelli, Terry & Wands

[57] ABSTRACT

A method of and apparatus for generating nuclear magnetic resonance of an object. It is desirable that a nuclear magnetic resonance image be obtained in such a maner that a portion of the image in which the user is interested in is displayed in a greater scale. To this end, nuclear magnetic resonance signals from a specific region of the image are picke-up by an aliasing phenomenon, into a predetermined signal band which is different from the signal band of the above-mentioned specific region.

8 Claims, 4 Drawing Sheets

METHOD AND APPARATUS FOR CAUSING NUCLEAR MAGNETIC RESONANCE OF AN OBJECT

TECHNICAL FIELD

The present invention relates to a method and an apparatus for causing nuclear magnetic resonance of an object and, more particularly, to a method and an apparatus for causing nuclear magnetic resonance of an object which are suitable for diagnosing living bodies by nuclear magnetic resonance.

BACKGROUND ART

Nuclear magnetic resonance has been used in the field of structural analysis, as well as studies on physical properties. In recent years, this phenomenon finds its use also in the field of medical diagnosis. Medical diagnostic apparatus making use of nuclear magnetic resonance signal for medical diagnosis are generally referred to as nuclear magnetic resonance imaging apparatus or magnetic resonance imaging apparatus.

In a typical nuclear magnetic resonance imaging apparatus which is well known, a magnetic field gradient $G_z$ is applied to a static magnetic field in a first predetermined period and, in this period, selective high-frequency 90° pulses are applied to the object disposed in the static magnetic field. As a result, a slice of the object perpendicular to the Z-axis is selectively excited. Namely, falling of nuclear spins onto the Y-axis takes place in the slice. The fallen nuclear spins are gradually dispersed.

Subsequently, the magnetic field gradient $G_z$ and selective high-frequency 180° pulses are applied so that the nuclear spins in the excited slice are inverted. In consequence, the dispersed nuclear spins gradually converge, whereby a spin echo signal is generated from the whole slice as a nuclear magnetic resonance signal.

In the period intermediate between the application of the selective high-frequency 90° pulse and the selective high-frequency 180° pulse, a magnetic field gradient $G_Y$ is applied to the static field and, after the application of the 180° pulse, the magnetic field gradient $G_x$ is applied to the static magnetic field, and the spin echo signal generated from the whole slice is read during the application of the magnetic field gradient $G_x$.

The described steps are executed N times to that N spin echo signals are generated. In the mean time, however, the magnetic field gradient $G_Y$ is varied in such a manner that the time integration value is changed at the same rate in each time. The magnetic field gradient $G_Y$ is referred to as "magnetic field gradient for phase encoding". Further, $G_x$ is for frequency encoding and is called a read magnetic field gradient. Sampling is executed to obtain N samples of each of N spin echo signals, and two-dimensional Fourier transformation is applied to each of N spin echo signals each having N sample signals, so that a nuclear magnetic resonance image constituted by N×N element signals is obtained. The number N is typically set to be 256.

In general, the center of the display image of the nuclear magnetic resonance imaging system coincides with the center of the gradient magnetic field which is given by the magnetic field gradients $G_Y$ and $G_x$. It is therefore not easy to obtain an enlarged image of an image portion which does not coincide with the center of the gradient magnetic field.

Japanese Patent Laid-Open No. 207045/1985 discloses an art which is intended to overcome the above-described problem.

According to this method, an axis which interconnects the center of the gradient magnetic field and the center of the image portion to be enlarged (imaging center) is selected as a frequency axis, while an axis perpendicular to this frequency axis is selected as a phase encode axis. Then, the detected nuclear magnetic resonance signal is subjected to homo-dyne detection by employing, as a reference signal, an image center resonance frequency which is determined from the distance between the image center and the center of the gradient magnetic field and the magnitude of the reading magnetic field gradient, so that the field of view is shifted along the frequency encoding axis.

This art, however, has the following disadvantages.

(1) It is necessary to employ means for varying the reference frequency.

(2) Phase shift inevitably occurs before and after the changing of the reference frequency. This must be compensated for at the cost of measuring time.

(3) The orientation of the imaging region may vary depending on the image center, with the result that the orientation of the displayed image also varies.

(4) This art is generally uneconomical because it necessitates generation of a large magnetic field gradient.

DISCLOSURE OF THE INVENTION

An object of the present invention is to provide a method and an apparatus for causing nuclear magnetic resonance of an object which are suitable for obtaining an enlarged image of a specific portion of the object image.

Another object of the present invention is to provide a method and an apparatus for causing nuclear magnetic resonance of an object which are capable of overcoming the above-described problems of the prior art.

According to the invention, an object is placed in a static magnetic field and selective high-frequency pulse is applied to the object in the presence of the magnetic field gradient to be applied to the static magnetic field, whereby a specified spatial area of the object is excited by nuclear magnetic resonance. On the basis of the nuclear magnetic resonance, nuclear magnetic resonance signals are generated from the specified spatial area and are sampled therefrom. The thus sampled nuclear magnetic resonance signals are stored on the basis of the reflection phenomenon in a predetermined signal band which is different from the signal band of the specified spatial area of the object.

THE BEST MODE FOR CARRYING OUT THE INVENTION

Figure 1:
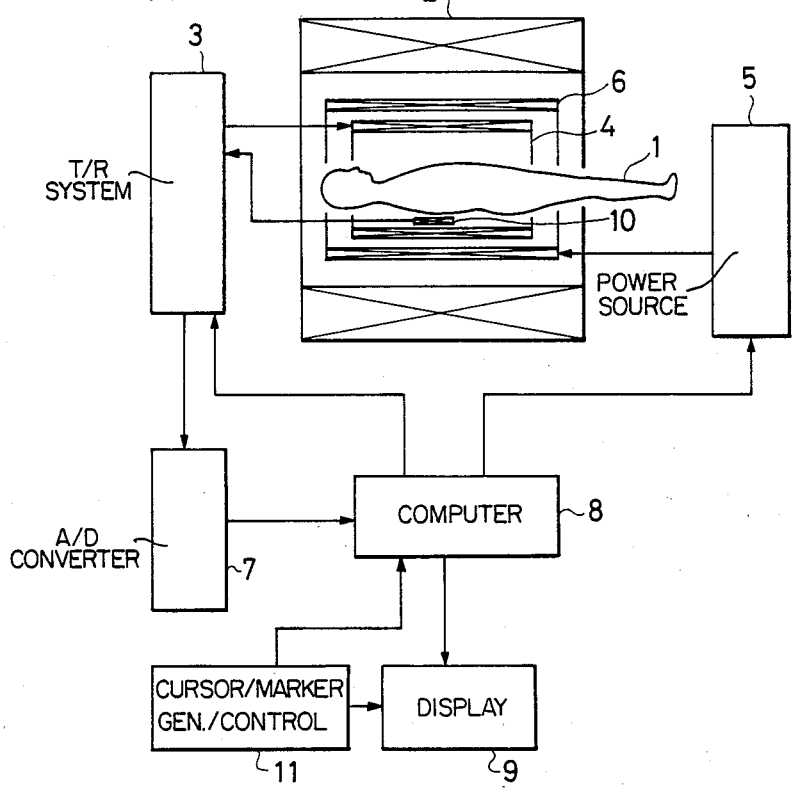
FIG. 1 is a block diagram of an embodiment of the nuclear magnetic resonance causing apparatus in accordance with the present invention.

Referring to FIG. 1, an object 1 to be examined is placed in a uniform static magnetic field generated by a magnet 2. A transmission/receiving system 3 generates a high-frequency pulse signal which is applied by a transmission/receiving coil device 4 to the object 1 so as to cause a nuclearmagnetic resonance excitation of the object 1. A power source 5 for generating magnetic field gradients is capable of generating magnetic field gradients in X, Y and Z directions, and thus generated magnetic field gradients are applied to the static magnetic field by means of a magnetic field gradient coil device 6. The nuclear magnetic resonance signal from the object 1 is detected by a receiving surface coil device 10. The detected nuclear magnetic resonance signal is converted into audible frequency signals by means of a transmission/receiving system 3, and is further changed into digital signals by means of an A/D converter 7. A computer 8 processes this signal so as to enable the nuclear magnetic resonance image of the object 1 to be displayed on the display device 9.

A device 11 for generating and moving a cursor signal is capable of displaying a cursor or marker on the display device 9 by means of a generated cursor or marker signal while effecting the movement of the same.

Figure 2:
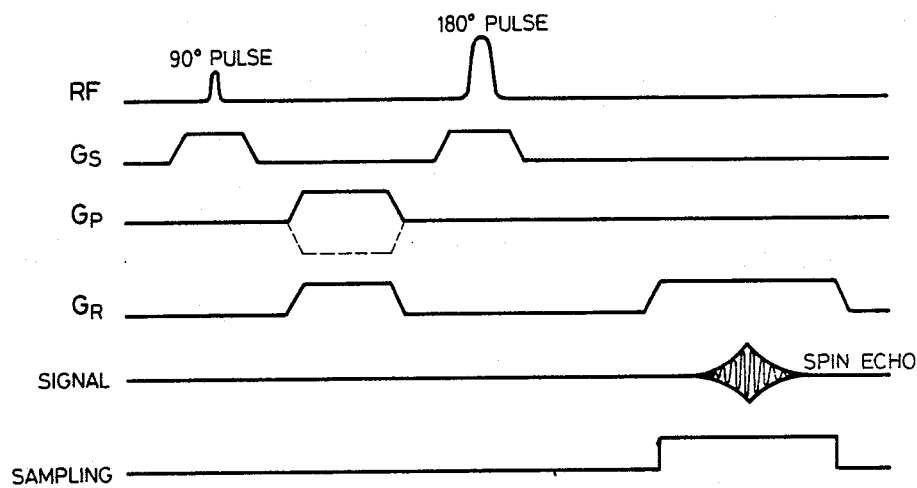
FIG. 2 is an illustration of a pulse sequence used together with the apparatus of FIG. 1.

Referring now to FIG. 2, a selective high-frequency 90° pulse is applied in the presence of a slice-selecting magnetic field gradient $G_S$. Assuming that the gradient $G_S$ is a gradient along the Z-axis, a slice perpendicular to the Z-axis is selectively excited. That is, the nuclear spins in the slice fall through 90°. The fallen nuclear spins are then gradually dispersed.

Subsequently, a magnetic field gradient $G_S$ and the selective high-frequency 180° pulse are applied, so that the nuclear spins in this slice are inverted. Therefore, the dispersed nuclear spin gradually converge, whereby a nuclear magnetic resonance signal is obtained from the whole slice.

In the period intermediate between the application of the selective high-frequency 90° pulse and the selective high-frequency 180° pulse, a phase encoding magnetic field gradient $G_p$ is applied and, after the application of the selective high-frequency 180° pulse, a reading magnetic gradient $G_R$ is applied. The echo signal from the entire part of the slice is read during the application of this reading magnetic field gradient $G_R$.

The described steps are repeated N times to that N spin echo signals are obtained. It is to be noted, however, the gradient $G_p$ is varied in each time of repetition in such a manner that the time integration value varies at a predetermined rate. Sampling is effected N times for each of N spin echo signals, and two-dimensional Fourier transformation is applied to N spin echo signals each consisting of N sampled signals, whereby a nuclear magnetic resonance image consisting of N×N element images is obtained. It is therefore possible to obtain an X-Y two-dimensional image, provided that the gradients $G_p$ and $G_R$ are determined along the Y and X axes, respectively.

The operation for repeating the above-mentioned steps N times for obtaining N spin echo signals is referred to as sampling.

The reading magnetic field gradient $G_R$ also is applied in the period intermediate between the application of the selective high-frequency 90° pulse and the selective high-frequency 180° pulse. This application is intended for compensating for any dephasing of the nuclear spins which may be caused by the earlier half part of the magnetic field gradient $G_R$ applied after the application of the selective high-frequency 180° pulse.

Figure 3:
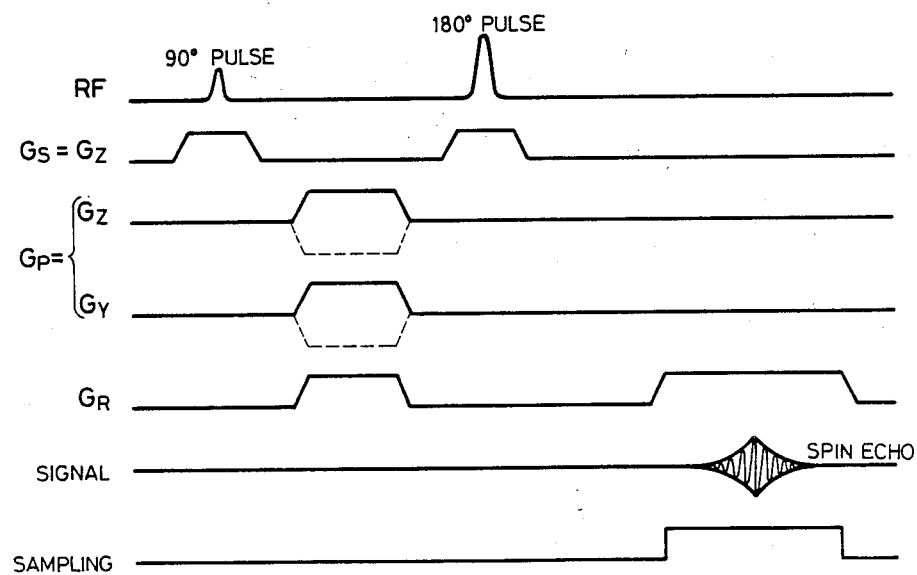
FIG. 3 is an illustration of another pulse sequence used together with the apparatus of FIG. 1.

Referring now to FIG. 3, an art shown in this Figure differs from that of FIG. 2 in that the phase encoding magnetic field gradient $G_p$ is composed of a magnetic field gradient $G_Z$ along the Z-axis and a magnetic field gradient $G_Y$ along the Y-axis. In the art shown in FIG. 3, the gradient $G_Y$ is changed from $G_{Y1}$ to $G_{YN}$ while setting the phase encoding magnetic field gradient $G_Z$ at $G_{Z1}$, and the spin echo signal is obtained each time $G_Y$ is changed. A similar spin echo signal is obtained while the signal $G_Z$ is changed from $G_{Z2}$ to $G_{ZN}$.

The spin echo signals obtained during the change of the gradient $G_{Y1}$ to $G_{YN}$ at each of the values of the gradient $G_Z$ varied between $G_{Z1}$ and $G_{ZN}$ are subjected to two-dimensional Fourier transformation and further Fourier transformation with respect to the gradient $G_Z$ at each point on the X-Y plane, whereby a three-dimensional image of the slice is obtained.

Assuming that the field of view to be observed is "l", while the number of change of the magnetic field gradient $G_p$ on the encoding axis, i.e., the number of times the sampling "N", the variance $\Delta G_p$ of the time integration of the gradient $G_p$ is given by the following formula.

$$\Delta G_P = (2/N) \int_0^{T_G} P_{ma} \times dt$$

The following formula is derived in accordance with the Nyquist theorem.

$$\pi = \gamma(2/N) \int_C^T G_{Pmax}(1/2)dt = (2l \cdot \Delta G_P)/2 \qquad (1)$$

$$\Delta G_P = 2\pi/\gamma l$$

The sampling interval $\Delta T$ is given by the following formula.

Namely, as shown in FIG. 2, the gradient $G_P$ is varied to meet the condition of the formula (1), while the sampling of the spin echo signal is conducted in such a manner as to meet the condition of the formula (2). This is also applied to the case of the art shown in FIG. 3.

$$\Delta T = 2\pi/\gamma G_R l \qquad (2)$$

A case is assumed here in which a band of the same width as a signal pick-up band meeting the Nyquist theorem is present on the left or the right side of the signal pick-up band. In such a case, there occurs a phenomenon that the signals on the band which is on the left or right side of the pick-up band appear unchanged in the signal pick-up band. This phenomenon is known as "fold-over" or "aliasing" in signal sampling. The aliased signal is superposed on the required signal to make it difficult to detect the necessary signal. In fact, an enormous endeavor is required to get rid of such aliased signal. The described embodiment of the invention, however, makes a positive use of such aliased signal.

Figure 4:
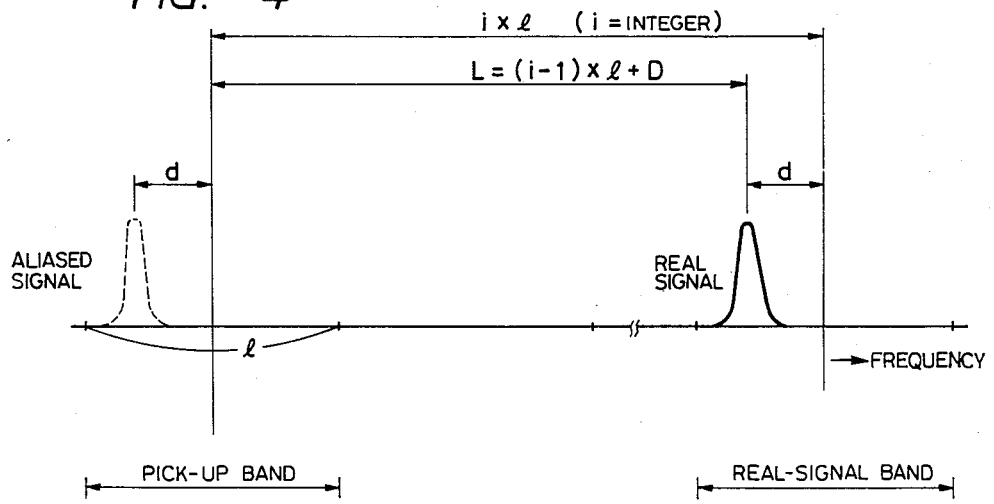
FIG. 4 is an illustration of the relationship between the aliased signal and the real signal.

Referring to FIG. 4, the pick-up band, i.e., the region which is to be observed or the field of view, is represened by "l", while the distance between the center of the field of view and the real signal of the aliased signals is represented by L. The remainder, which is obtained after division of L by "l", is represented by D. Thus, the distance L is represented by $L=(i-1)l+D$, where i represents an integer. On the other hand, the distance between the center of the real signal band and the center of the pick-up band is represented by il. Therefore, the amount d of shift which is necessary for displaying the aliased signal in the center of the pick-up band is given by the following formula (3).

$$d=li-\{(i-1)l+D\}=l-D \qquad (3)$$

The shift of signal for reducing the shift amount d to zero (0) is nothing but the scroll. In FIG. 4, the axis of abscissa represents frequency.

Figure 5:
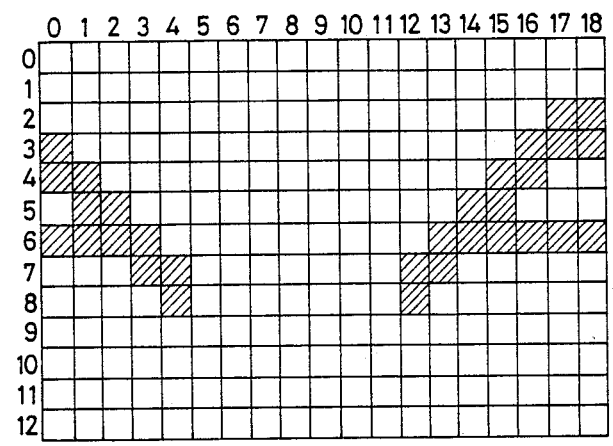
FIGS. 5 and 6 are illustrations of a scroll.
Figure 6:
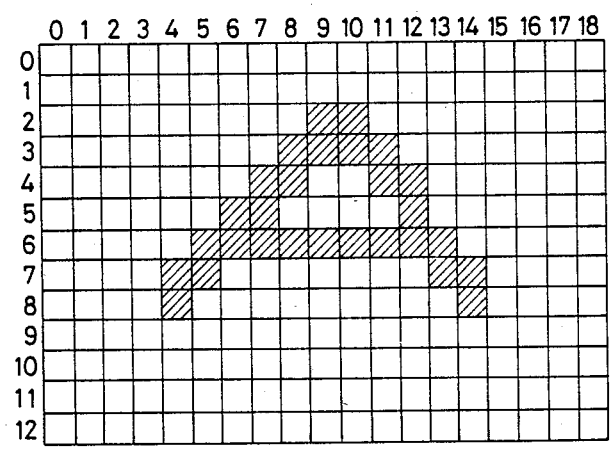

FIGS. 5 and 6 show the manner of the scrolling. Referring to FIG. 5, if the center of the display screen does not coincide with the center of the image region to be observed, it is necessary to effect a suitable operation for attaining coincidence between these centers. This operation is the scrolling. The state after the scrolling is shown in FIG. 6.

The scrolling is done not in the display screen but in the computer 8. In other words, the positions of the pixels in the display screen and the address in the memory of the computer 8 correspond to each other. FIG. 5 and 6 show, by way of example, an alphabetic letter A displayed by means of a matrix of 13×19 pixels. In the state of FIG. 5, the letter A has been shifted to the right. The movement of this letter to the center of the field of view as shown in FIG. 6 is effected by scrolling the image by an amount corresponding to 8 pixels to the left. That is, the data in the address (2, 17) which is one of the apices is shifted to the address (2, 9), while the data in the address (2, 9) is shifted to a new address (2, 1). Similarly, other data are shifted to addresses which are obtained by subtracting 8 from the column addresses without changing line addresses. The numeral on the left side of the address representation indicates the line address, while the numeral on the right side represents the column address.

Although the scrolling in a specified-dimensional direction has been described, it will be apparent that the scrolling in other-dimensional directions can be effected by the same method.

Figure 7:
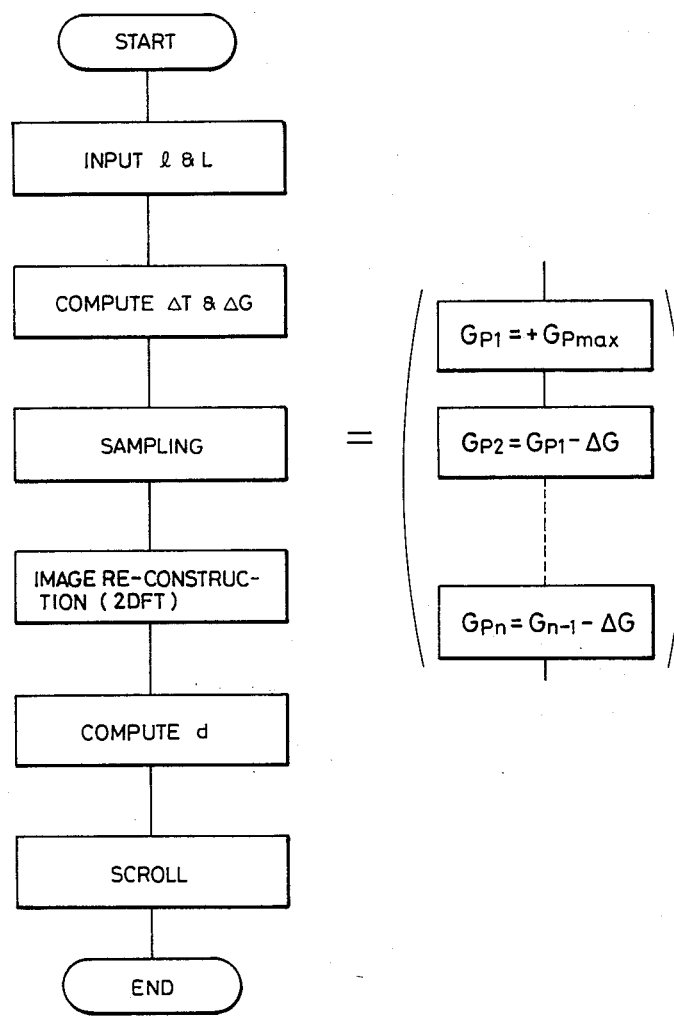
FIG. 7 is a chart showing the flow of the automatic scrolling.

A description will be made hereinunder as to the automatic scrolling operation, with specific reference to FIG. 7. The operator inputs to the computer 8 the distance between the center of the field of view 1, i.e., the center of the pick-up band, and the real signal. The computer 8 then computes the values $\Delta G$ and $\Delta T$ in accordance with the formulae (1) and (2). Then, the sampling is executed in accordance with the commands given by the computer 8. More specifically, the gradient $G_P$ is changed in a stepped manner with a pitch $\Delta G$ and the sequence of FIG. 2 is executed each time the gradient $G_P$ is changed by $\Delta G$. Thereafter, an image reconstructing operation which is the aforementioned two-dimensional Fourier transformation is executed, followed by the computation of the scroll amount d in accordance with the formula (3), and the scrolling is effected by the amount d.

It is thus possible to automatically display the aliased signal on the center of the screen. Needless to say, signals other than the aliased signals are not displayed on the screen. The automatic scrolling can be effected in the same way also in the case of FIG. 3.

A description will be made hereinunder as to the manner of inputting the values L and "l". As the first step, a spatial area large enough to cover the field of view is excited so that the nuclear magnetic resonance image of this spatial area is obtained. The nuclear magnetic resonance signals from this area are detected by means of the surface coil device 10. The operator operates the device 11 for generating and moving the cursor signals so as to put a cursor on display and brings the cursor to a position within the field of view 1. In consequence, the field of view 1 is input to the computer 8. The computer 8 then computes the distance L between the center of the screen (center of the gradient magnetic field) and the center of the field of view 1, in accordance with the input information.

Japanese Patent Laid-Open Nos. 60-185149 and in 60-185149 disclose techniques which may be used for the purpose of selective excitation of the field of view 1.

As will be understood from the foregoing description, according to the present invention, it is possible to effect imaging of a region which is off the center of the gradient magnetic field, very easily and without necessitating any specific device.

We claim:

1. A method of causing nuclear magnetic resonance of an object, comprising the steps of:
   causing nuclear magnetic resonance excitation of a predetermined region of the object defined by a predetermined frequency band so as to generate a nuclear magnetic resonance signal from the predetermined region of the object; and
   sampling the nuclear magnetic resonance signal so as to produce an aliased signal thereon in a frequency band in accordance with the Nyquist theorem and which differs from the predetermined frequency band to enable imaging of the predetermined region of the object in accordance with the aliased signal.

2. A method according to claim 1, wherein the step of causing nuclear magnetic resonance excitation includes generating a static magnetic field in which the object is arranged, generating a selective high frequency pulse, generating a gradient magnetic field in a predetermined direction and applying the gradient magnetic field to the static magnetic field, and applying a selective high frequency pulse to the object.

3. A method according to claim 1, further comprising the step of displacing the aliased signal so as to make the aliased signal substantially coincident with the center of the frequency band in accordance with the Nyquist theorem.

4. A method according to claim 2, further comprising the step of shifting the aliased signal so as to bring the aliased signal into substantial coincidence with the center of the frequency band in accordance with the Nyquist theorem.

5. An apparatus for causing nuclear magnetic resonance of an object, comprising:
   means for producing nuclear magnetic resonance excitation of a predetermined region of the object defined by a predetermined frequency band so as to generate a nuclear magnetic resonance signal from the predetermined region of the object; and
   means for sampling the nuclear magnetic resonance signal so as to produce an aliased signal thereon in a frequency band in accordance with the Nyquist theorem and which differs from the predetermined frequency band to enable imaging of the predetermined region of the object in accordance with the aliased signal.

6. An apparatus according to claim 5, wherein the nuclear magnetic resonance excitation producing means includes means for generating a static magnetic field in which the object is arranged, means for generating a selective high frequency pulse, means for generating a gradient magnetic field in a predetermined direction and for applying the gradient magnetic field to the static magnetic field, and means for applying the selective high frequency pulse to the object.

7. An apparatus according to claim 5, further comprising means for displacing the aliased signal so as to make the aliased signal substantially coincident with the center of the frequency band in accordance with the Nyquist theorem.

8. An apparatus according to claim 6, further comprising means for shifting the aliased signal so as to bring the aliased signal into substantial coincidence with the center of the frequency band in accordance with the Nyquist theorem.

* * * * *